(12) United States Patent
Hiratani et al.

(10) Patent No.: US 11,343,913 B2
(45) Date of Patent: May 24, 2022

(54) CIRCUIT BOARD STRUCTURE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shungo Hiratani, Yokkaichi (JP); Shinsuke Okumi, Yokkaichi (JP); Arinobu Nakamura, Yokkaichi (JP); Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/260,913

(22) PCT Filed: Jul. 12, 2019

(86) PCT No.: PCT/JP2019/027779
§ 371 (c)(1),
(2) Date: Jan. 15, 2021

(87) PCT Pub. No.: WO2020/017470
PCT Pub. Date: Jan. 23, 2020

(65) Prior Publication Data
US 2021/0267058 A1 Aug. 26, 2021

(30) Foreign Application Priority Data

Jul. 18, 2018 (JP) .............................. JP2018-135251

(51) Int. Cl.
*H05K 1/18* (2006.01)
*H05K 1/14* (2006.01)
(Continued)

(52) U.S. Cl.
CPC ................. *H05K 1/14* (2013.01); *H02G 3/16* (2013.01); *H05K 1/028* (2013.01); *H05K 1/181* (2013.01);
(Continued)

(58) Field of Classification Search
CPC .......... H05K 1/14; H05K 1/028; H05K 1/181; H05K 7/06; H05K 2201/10166; H05K 2201/10272; H02G 3/16
(Continued)

(56) References Cited

U.S. PATENT DOCUMENTS

| 6,212,087 B1 * | 4/2001 | Grant | H05K 7/1432 |
| | | | 361/715 |
| 2014/0185242 A1 * | 7/2014 | Kim | H01L 23/367 |
| | | | 361/707 |
| 2018/0368249 A1 | 12/2018 | Chin et al. | |

FOREIGN PATENT DOCUMENTS

| JP | 2002-95138 A | 3/2002 |
| JP | 2006-33994 A | 2/2006 |

(Continued)

OTHER PUBLICATIONS

International Search Report, Application No. PCT/JP2019/027779, dated Sep. 10, 2019. ISA/Japan Patent Office.

*Primary Examiner* — Binh B Tran
(74) *Attorney, Agent, or Firm* — Honigman LLP

(57) ABSTRACT

Provided is a circuit board structure including a first circuit board having bus bars and a second circuit board arranged spaced apart from the first circuit board, multiple FET being arranged on the bus bars, and terminals of the multiple FETs being connected to the bus bars. The circuit board structure includes a conducting wire group sheet that covers a portion of the bus bar and is provided with multiple conducting wires that allow electricity to flow between gate terminals of the FETs and the second circuit board. The semiconductor (Continued)

element FETs, which are arranged side by side, are provided such that the gates terminals are arranged in the same direction with respect to the direction in which the semiconductor element FETs are arranged side by side.

9 Claims, 4 Drawing Sheets

(51) Int. Cl.
  *H02G 3/16* (2006.01)
  *H05K 1/02* (2006.01)
  *H05K 7/06* (2006.01)
(52) U.S. Cl.
  CPC ..... *H05K 7/06* (2013.01); *H05K 2201/10166* (2013.01); *H05K 2201/10272* (2013.01)
(58) Field of Classification Search
  USPC ....... 361/719, 748, 749, 760, 764, 775, 777, 361/783, 784, 790
  See application file for complete search history.

(56) References Cited

FOREIGN PATENT DOCUMENTS

| | | | |
|---|---|---|---|
| JP | 2016-220277 A | 12/2016 | |
| JP | 2017-139303 A | 8/2017 | |

\* cited by examiner

CIRCUIT BOARD STRUCTURE

CROSS-REFERENCE TO RELATED APPLICATIONS

This application is the U.S. national stage of PCT/JP2019/027779 filed on Jul. 12, 2019, which claims priority of Japanese Patent Application No. JP 2018-135251 filed on Jul. 18, 2018, the contents of which are incorporated herein.

TECHNICAL FIELD

The present disclosure relates to a circuit board structure.

BACKGROUND

Conventionally, a circuit board structure has been generally known in which a conductive piece (also called a bus bar or the like) included in a circuit for conducting a relatively large current is provided on a circuit board in which a conduction pattern forming a circuit that conducts a relatively small current is formed.

JP 2016-220277A discloses an electrical connection box having a pair of bus bars, power semiconductors mounted on the pair of bus bars, a control circuit board on which a control unit for controlling the power semiconductors is mounted, and an FPC that is provided on the upper surfaces of the pair of bus bars and is for electrically connecting control terminals of the power semiconductors and the control circuit board.

However, in the electrical connection box of JP 2016-220277A, the FPC is provided so as to cover approximately the entire surfaces of the pair of bus bars, and therefore the FPC is large and it is difficult to make the electrical connection box compact.

Also, since the FPC covers approximately the entire surfaces of the pair of bus bars, it is necessary to provide notches in the FPC according to the positions of the terminals of the power semiconductors in order to electrically connect the power semiconductors and the pair of bus bars. Accordingly, the shape of the FPC is complex.

In view of this, an object is to provide a compact circuit board structure with a simpler structure.

SUMMARY

A circuit board structure according to one aspect of the present disclosure is a circuit board structure including a first circuit board having a conductive piece and a second circuit board arranged spaced apart from the first circuit board, a plurality of semiconductor elements being arranged on the conductive piece, and terminals of the plurality of semiconductor elements being connected to the conductive piece, the circuit board structure including a conducting wire group sheet that covers a portion of the conductive piece and is provided with a plurality of conducting wires that allow electricity to flow between specific terminals of the semiconductor elements and the second circuit board. The semiconductor elements, which are arranged side by side, are provided such that the specific terminals are arranged in the same direction with respect to the direction in which the semiconductor elements are arranged side by side.

Advantageous Effects of the Present Disclosure

According to the present disclosure, it is possible to provide a compact circuit board structure with a simpler structure.

DETAILED DESCRIPTION OF PREFERRED EMBODIMENTS

Figure 1:
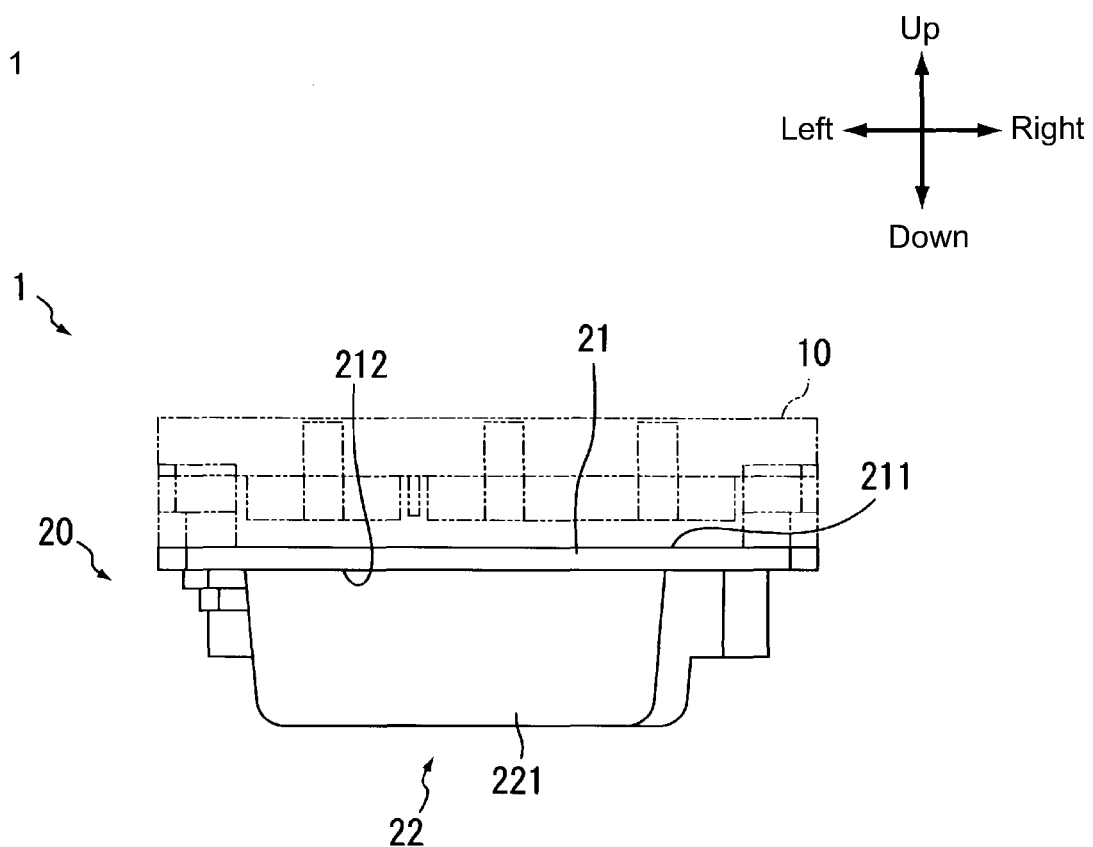
FIG. 1 is a front view of an electrical apparatus according to the present embodiment.

First, embodiments of the present disclosure will be listed and described. At least a portion of the embodiments described below may also be combined as appropriate.

A circuit board structure according to one aspect of the present disclosure is a circuit board structure including a first circuit board having a conductive piece and a second circuit board arranged spaced apart from the first circuit board, a plurality of semiconductor elements being arranged on the conductive piece, and terminals of the plurality of semiconductor elements being connected to the conductive piece, the circuit board structure including a conducting wire group sheet that covers a portion of the conductive piece and is provided with a plurality of conducting wires that allow electricity to flow between specific terminals of the semiconductor elements and the second circuit board. The semiconductor elements, which are arranged side by side, are provided such that the specific terminals are arranged in the same direction with respect to the direction in which the semiconductor elements are arranged side by side.

In the present aspect, the specific terminals of the plurality of semiconductor elements of the first circuit board are collectively connected via the conducting wire group sheet to the second circuit board provided spaced apart from the first circuit board. Also, the specific terminals of the plurality of semiconductor elements that are arranged side by side are arranged in the same direction with respect to the direction in which the semiconductor elements are arranged side by side.

Accordingly, it is sufficient that the conducting wire group sheet is provided only near the specific terminals of the multiple semiconductor elements that are arranged side by side, and thus the conducting wire group sheet can be reduced in size and given a simple structure. Consequently, the circuit board structure can be made compact.

In a circuit board structure according to one aspect of the present disclosure, the conducting wire group sheet includes an insulating film that insulates the conductive piece and the conducting wire from each other, the conducting wire group sheet is adhered on the conductive piece, and the circuit board structure includes an upper-side circuit element arranged on a portion of the conducting wire group sheet.

In the present aspect, the upper-side circuit element is arranged on the conducting wire group sheet, on the upper side of the conductive piece. Accordingly, another circuit element can be mounted also on the upper side of the conductive piece, and the circuit board structure can be made compact.

In a circuit board structure according to one aspect of the present disclosure, the conducting wire group sheet is an FPC (Flexible Printed Circuit).

In the present aspect, an FPC is used as the conducting wire group sheet. Accordingly, the step of manufacturing the circuit board can be simplified.

In a circuit board structure according to one aspect of the present disclosure, the first circuit board and the second circuit board are arranged opposing each other, and the conducting wire group sheet is adhered on a surface of the first circuit board that opposes the second circuit board.

In the present aspect, the conducting wire group sheet is adhered to the surface of the first circuit board that opposes the second circuit board, and therefore the length of the conducting wire group sheet to the second circuit board can be shortened.

In a circuit board structure according to one aspect of the present disclosure, the semiconductor elements are field effect transistors, and the specific terminals are gate terminals.

In the present aspect, the gate terminals of the multiple field effect transistors of the first circuit board are collectively connected via the conducting wire group sheet to the second circuit board that is arranged spaced apart from the first circuit board. Also, the gate terminals of the multiple field effect transistors that are arranged side by side are arranged in the same direction with respect to the direction in which the multiple field effect transistors are arranged side by side.

Accordingly, it is sufficient that the conducting wire group sheet is provided only near the gate terminals of the multiple aligned field effect transistors, and thus the conducting wire group sheet can be reduced in size and given a simple structure.

The present disclosure will be described specifically with reference to the drawings showing the embodiment. A circuit board structure according to an embodiment of the present disclosure will be described hereinafter with reference to the drawings. Note that the present disclosure is not limited to these illustrative examples, but is indicated by the claims, and all modifications within the meaning and scope of equivalency to the claims are intended to be encompassed therein.

An electrical apparatus including the circuit board structure according to the present embodiment will be described as an example hereinafter.

FIG. 1 is a front view of an electrical apparatus 1 according to the present embodiment.

The electrical apparatus 1 forms an electrical connection box that is to be disposed on a power supply path between a power source such as a battery included in a vehicle and a load composed of an in-vehicle electrical component such as a lamp or a wiper, a motor, or the like. The electrical apparatus 1 is used as, for example, a DC-DC converter or a semiconductor element such as an inverter.

Figure 2:
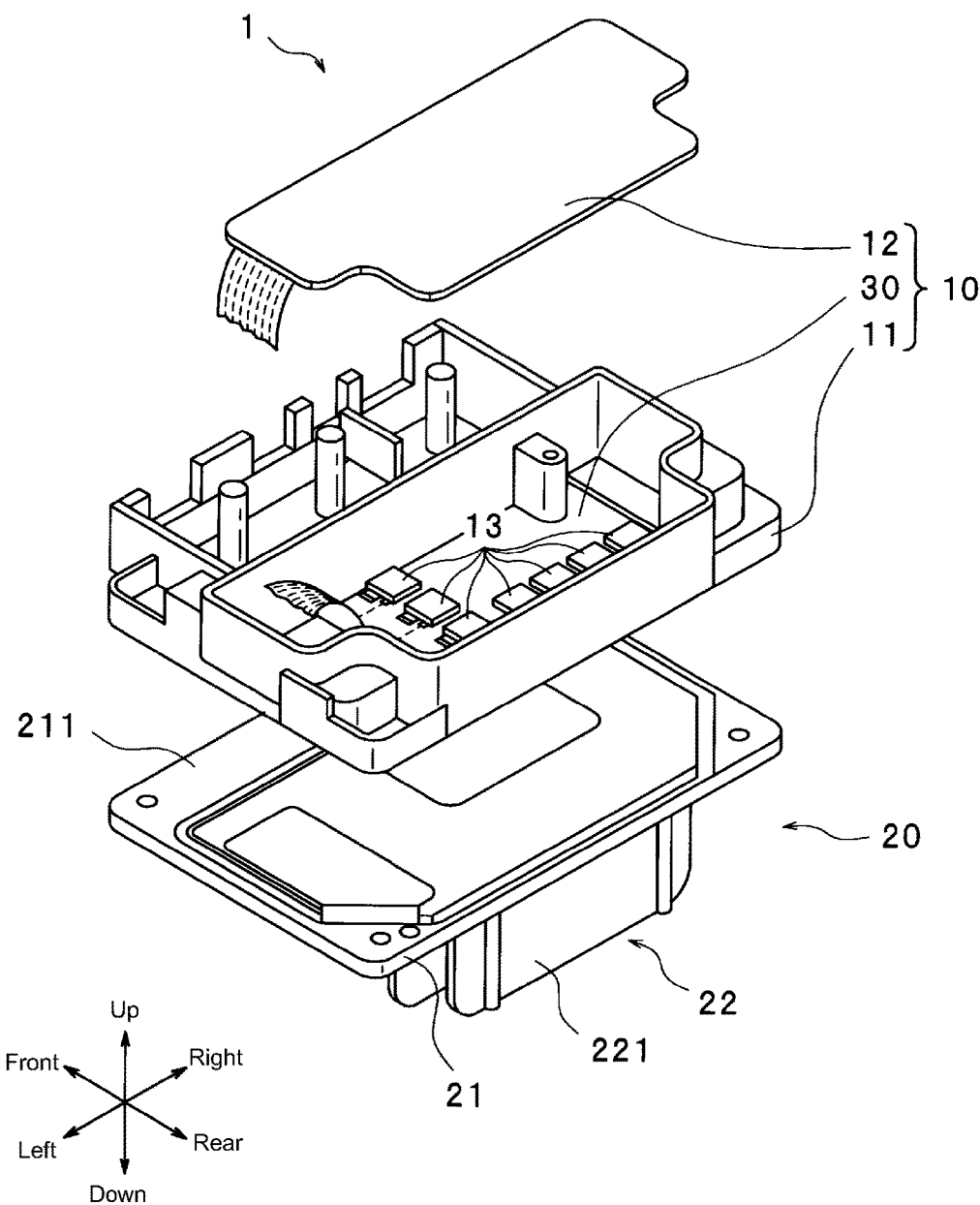
FIG. 2 is an exploded view of the electrical apparatus according to the present embodiment.

The electrical apparatus 1 includes a circuit board structure 10 and a support member 20 that supports the circuit board structure 10. FIG. 2 is an exploded view of the electrical apparatus 1 according to the present embodiment.

In the present embodiment, for the sake of convenience, "front", "rear", "left", "right", "up", and "down" of the electrical apparatus 1 are defined using the front-rear, left-right, and up-down directions shown in FIGS. 1 and 2. Hereinafter, description will be given using the front-rear, left-right, and up-down directions defined in this manner.

The circuit board structure 10 includes a power circuit board 30 (first circuit board) having bus bars that form a power circuit, semiconductor elements 13 that are mounted on the bus bars, and the like, and a control circuit board 12 (second circuit board) that controls the switching on/off of the power circuit board 30. The semiconductor elements 13 are mounted as appropriate according to the application of the electrical apparatus 1, and include, for example, a switching element such as an FET (Field Effect Transistor), a resistor, a coil, a capacitor, and the like.

The support member 20 includes a base portion 21 having a support surface 211 that supports the circuit board structure 10 on its upper surface, a heat dissipation portion 22 that is provided on a surface (lower surface 212) on a side opposite to the supporting surface 211, and multiple leg portions (not shown) that are provided on both the left and right ends of the base portion 21 with the heat dissipation portion 22 interposed therebetween. The base portion 21, the heat dissipation portion 22, and the leg portions included in the support member 20 are formed in one piece through, for example, die casting using a metal material such as aluminum or an aluminum alloy.

The base portion 21 is a rectangular flat member having an appropriate thickness. The circuit board structure 10 is fixed to the support member 211 of the base portion 21 using a known method such as adhesion, screwing, or soldering.

The heat dissipation portion 22 includes multiple heat dissipation fins 221 that protrude downward from the lower surface 212 of the base portion 21 and dissipates heat generated from the circuit board structure 10 to the outside. The multiple heat dissipation fins 221 extend in the left-right direction and are arranged side by side with a predetermined interval therebetween in the front-rear direction.

Figure 3:
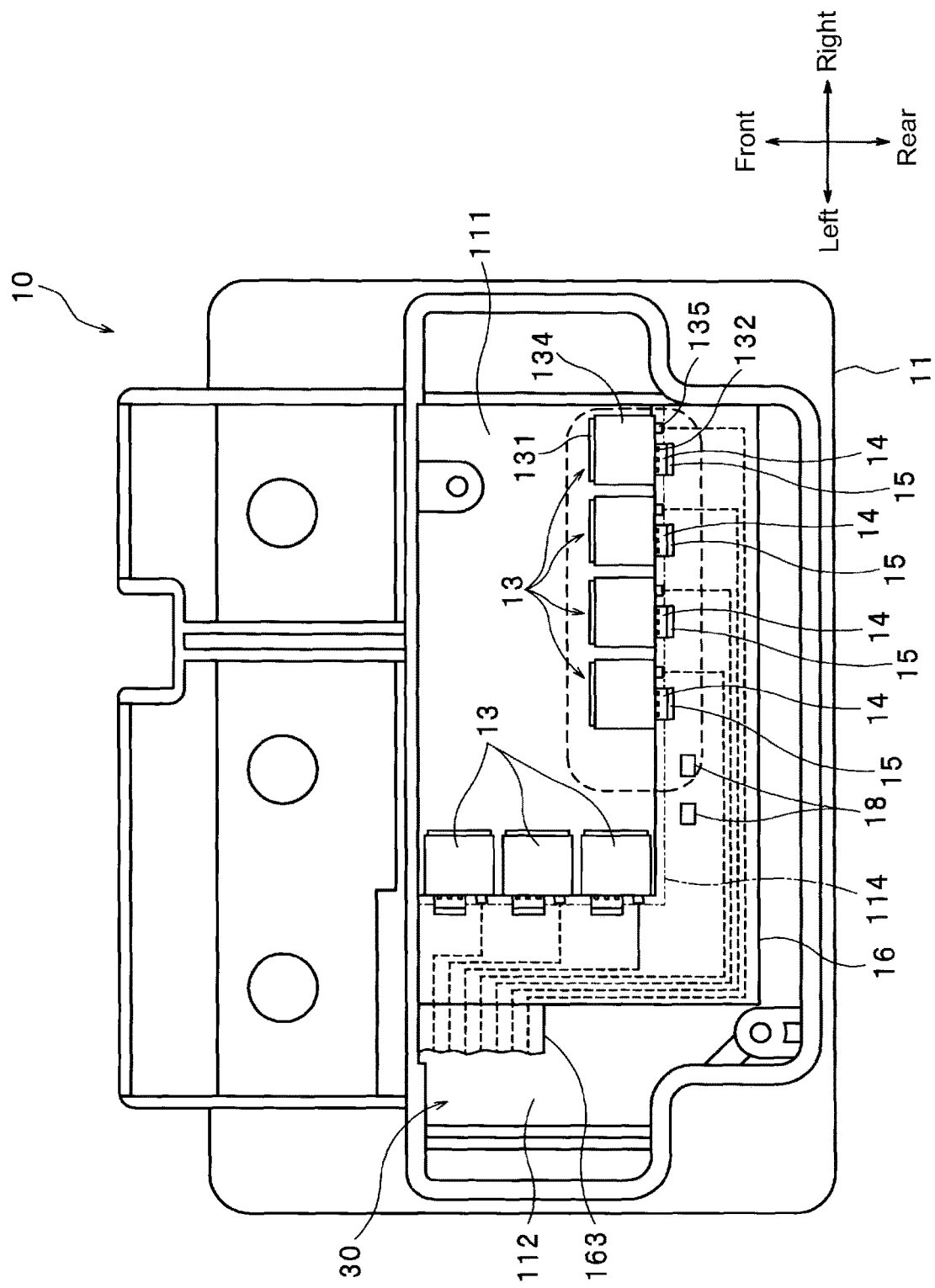
FIG. 3 is a plan view from above of the circuit board structure of the electrical apparatus according to the present embodiment.

FIG. 3 is a plan view from above of the circuit board structure 10 of the electrical apparatus 1 according to the present embodiment. FIG. 3 shows a circuit board structure 10 in a state in which the control circuit board 12 has been removed, for the sake of convenience in the description.

The circuit board structure 10 includes a power circuit board 30, a control circuit board 12 in which a control circuit that provides an on/off signal to the power circuit board 30 is mounted, and an accommodation portion 11 that accommodates the power circuit board 30 and the control circuit board 12. The control circuit board 12 and the power circuit board 30 are provided spaced apart from each other.

On an opposing surface opposing the control circuit board 12, the power circuit board 30 is provided with bus bars 111 and 112 (conductive pieces) and the multiple semiconductor switching elements 13 (semiconductor elements) that receive input of a control signal from the control circuit board 12 and switch between conduction and non-conduction based on the input control signal.

The bus bars 111 and 112 of the power circuit board 30 are provided on the same plane. An insulating region 114 is interposed between the bus bar 111 and the bus bar 112. The insulating region 114 is hidden by a later-described conducting wire group sheet 16. In FIG. 3, the insulating region 114 is denoted by a one-dot chain line.

The bus bar 111 has a rectangular plate shape, and bus bars 112 are provided near the two adjacent sides of the bus bar 111 with the insulating region 114 interposed therebetween. Similarly to the bus bar 111, the bus bar 112 also has a plate shape. The bus bar 111 and the bus bar 112 are conductive plate members that are made of a metal material such as copper or a copper alloy.

For example, the insulating region 114 is manufactured through insert molding using an insulating resin material such as phenol resin or glass epoxy resin. The insulating region 114 may also be formed in one piece with the accommodation portion 11, for example.

The semiconductor switching element 13 is, for example, a field effect transistor (FET), and more specifically, a surface-mount power MOSFET. The semiconductor switching element 13 (hereinafter referred to as "FET 13") is arranged on the bus bar 111 or the bus bar 112. In the present embodiment, a case in which seven FETs 13 are arranged on the bus bar 111 will be described as an example.

That is, in the example of FIG. 3, four of the seven FETs 13 are arranged side by side along one long side of the rectangular bus bar 111, and the remaining three FETs 13 are arranged side by side along one short side adjacent to the one long side. In other words, the four FETs 13 that are arranged side by side along the one long side of the bus bar 111 and the three FETs 13 that are arranged side by side along the one short side of the bus bar 111 are arranged side by side in mutually different directions.

The bus bar 111 is a bus bar that connects to drain terminals of the FETs 13, and the bus bar 112 is a bus bar that connects to source terminals of the FETs 13. Hereinafter, the bus bar 111 and the bus bar 112 will also be called a drain bus bar 111 and a source bus bar 112 respectively.

Also, in addition to the FETs 13, semiconductor elements such as Zener diodes may also be mounted on the upper sides of the bus bars 111 and 112.

Note that in the example of FIG. 3, a configuration was shown in which four FETs 13 are arranged side by side on the one long side of the drain bus bar 111 and three FETs 13 are arranged side by side on the one short side of the drain bus bar 111, but there is no limitation to this. Four or more FETs 13 may also be arranged side by side on the one long side of the drain bus bar 111, and three or more FETs 13 may also be arranged side by side on the one short side of the drain bus bar 111.

Figure 4:
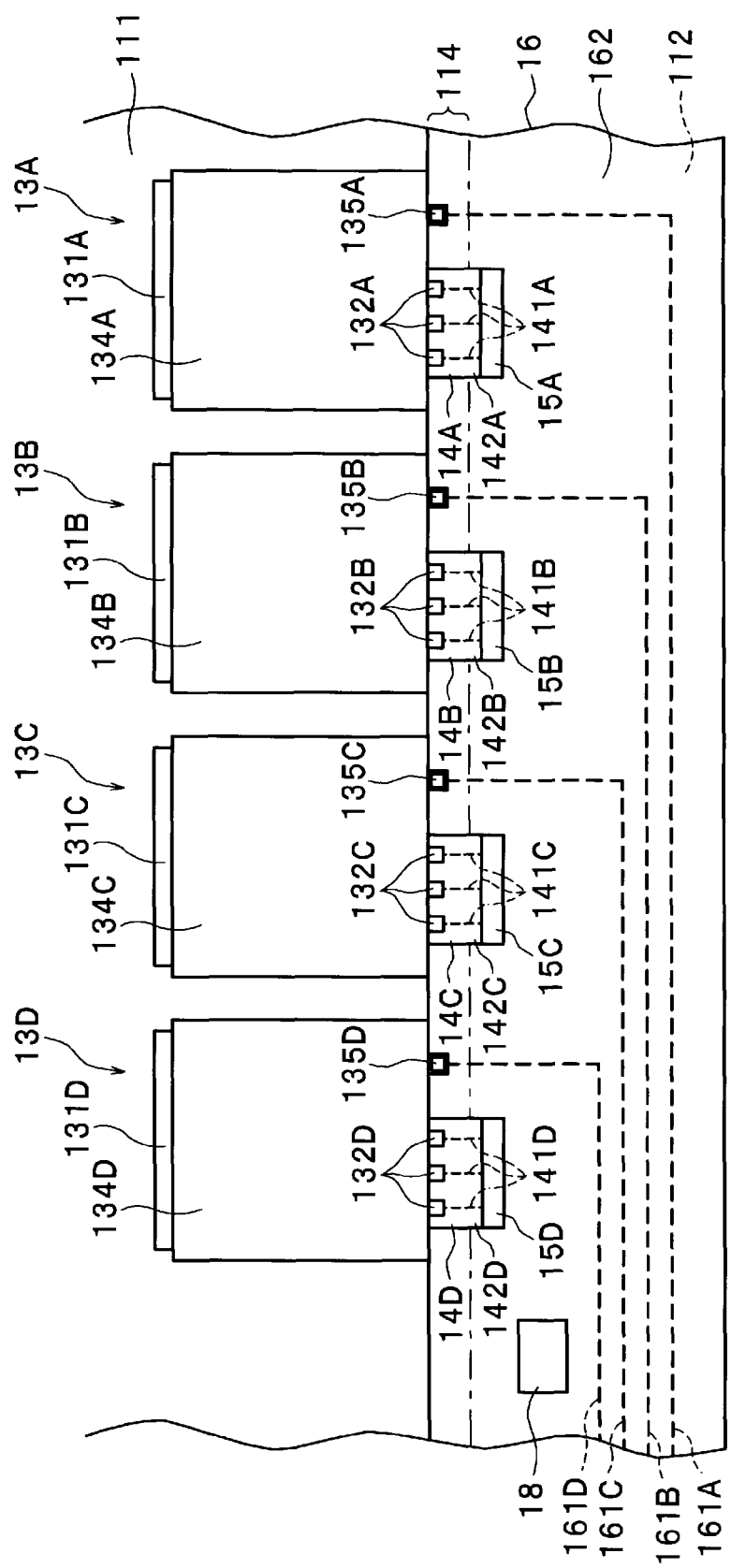
FIG. 4 is an enlarged view showing the vicinity of FETs arranged side by side in the circuit board structure according to the present embodiment.

FIG. 4 is an enlarged view showing the vicinity of the FETs 13 that are arranged side by side in the circuit board structure 10 according to the present embodiment. That is, FIG. 4 is an enlarged view of the broken-line oval portion in FIG. 3.

The conducting wire group sheet 16 is provided on the source bus bar 112. The conducting wire group sheet 16 covers a portion of the source bus bar 112 and allows electricity to flow between the gate terminals 135 (specific terminals) of the FETs 13 and the control circuit board 12. The conducting wire group sheet 16 is L-shaped. The conducting wire group sheet 16 is provided so as to cover the insulating region 114 along the one long side and the one short side of the drain bus bar 111.

The through-wire group sheet 16 includes conducting wires 161 that electrically connect the gate terminals 135 of the FETs 13 and the control circuit board 12, and an insulating film 162 that insulates the conducting wires 161 from the drain bus bar 111 and the source bus bar 112.

That is, the gate terminals 135 of the FETs 13 are electrically connected to the control circuit board 12 via the conducting wires 161, and the conducting wire group sheet 16 collectively includes these multiple conducting wires 161.

For example, the conducting wires 161 are composed of copper foil, the insulating film 162 is composed of resin, and the multiple conducting wires 161 are embedded inside of the insulating film 162. The conducting wire group sheet 16 may also be, for example, an FPC (Flexible Printed Circuit).

Also, there is no limitation thereto, and multiple conducting wires 161 may also be adhered on the insulating film 162.

Also, the conducting wire group sheet 16 includes an expanded portion 163 on one end portion, and the expanded portion 163 extends to the control circuit board 12 arranged opposing the power circuit board 30 and is electrically connected to the control circuit board 12. In FIG. 2, for the sake of convenience, the conducting wire group sheet 16 is shown as being disconnected, but in actuality, it is connected.

Hereinafter, the connection relationship between the FETs 13 and the drain bus bars 111, the source bus bars 112, and the conducting wire group sheet 16 will be described in detail. This description will be given using the four FETs 13 shown in FIG. 4 as an example. Also, description of the three FETs 13 is omitted.

The four FETs 13, namely an FET 13A, an FET 13B, an FET 13C, and an FET 13D, are arranged side by side in the stated order on the one long side of the drain bus bar 111. Hereinafter, the FETs 13A to 13D will also be referred to collectively as "FETs 13".

The FETs 13A to 13D are fixed to the drain bus bar 111. At this time, the FETs 13A to 13D are provided such that the gate terminals 135 are arranged in the same direction with respect to the direction in which the FETs 13A to 13D are arranged side by side. In FIGS. 3 and 4, all of the gate terminals 135 of the FETs 13A to 13D are arranged so as to face rearward, that is, the outer side of the drain bus bar 111.

The FET 13A includes an element main body 134A, and a drain terminal 131A and three source terminals 132A on mutually opposite sides with the element main body 134A interposed therebetween. For example, the drain terminal 131A is provided on the front side with respect to the element main body 134A and the source terminals 132A is provided on the rearward side with respect to the element main body 134A. Also, the FET 13A includes the gate terminal 135A, and for example, the gate terminal 135A is provided near the source terminals 132A. However, the position of the gate terminal 135A is not limited thereto.

The FET 13A is fixed to the drain bus bar 111 through soldering. Furthermore, the drain terminal 131A of the FET 13A is electrically connected to the drain bus bar 111 through solder connection.

On the other hand, the FET 13A is arranged along the insulating region 114 such that the source terminals 132A face rearward, or in other words, such that the source terminals 132A face the source bus bar 112.

Also, the source terminals 132A are electrically connected via the connection sheet 14A to the source bus bar 112 that is spaced apart from the source terminals 132A with the insulating region 114 interposed therebetween. That is, the connection sheet 14A is provided on the bus bars 111 and 112 so as to span over the insulating region 114.

The connection sheet 14A includes linear conduction portions 141A (indicated by broken lines in FIG. 4) that electrically connect the source terminals 132A and the source bus bar 112, and an insulating portion 142A that insulates the conduction portions 141A from the drain bus bar 111. Ends on one side of the conduction portions 141A are connected by solder to the source terminals 132A, and the ends on the other side of the conduction portions 141A are connected by solder to the source bus bar 112. That is, the other end of the connection sheet 14A is connected to the source bus bar 112 via the solder connection portion 15A. The connection sheet 14A may also be, for example, an FPC.

The gate terminal 135A of the FET 13A is electrically connected to one end of the conducting wire 161A of the conducting wire group sheet 16. The conducting wire 161A extends to the control circuit board 12 through the expanded portion 163, and the other end of the conducting wire 161A is electrically connected to the control circuit board 12.

The FET 13B includes a drain terminal 131B, source terminals 132B, and a gate terminal 135B, and the source terminals 132B are connected to the source bus bar 112 via a connection sheet 14B. The connection sheet 14B is connected by solder to the source bus bar 112 at a solder connection portion 15B. Also, the gate terminal 135B is electrically connected to one end of the conducting wire 161B.

The FET 13C includes a drain terminal 131C, source terminals 132C, and a gate terminal 135C, and the source terminals 132C are connected to the source bus bar 112 via the connection sheet 14C. The connection sheet 14C is connected by solder to the source bus bar 112 at a solder connection portion 15C. Also, the gate terminal 135C is electrically connected to one end of the conducting wire 161C.

The FET 13D includes a drain terminal 131D, source terminals 132D, and a gate terminal 135D, and the source terminals 132D are connected to the source bus bar 112 via the connection sheet 14D. The connection sheet 14D is connected by solder to the source bus bar 112 at a solder connection portion 15D. Also, the gate terminal 135D is electrically connected to one end of the conducting wire 161D.

The connection relationships between the FET 13B, the FET 13C, and the FET 13D and the drain bus bar 111, the source bus bar 112, and the conducting wire group sheet 16 are the same as that of the FET 13A, and detailed description thereof is omitted.

The conducting wire group sheet 16 is provided along the insulating region 114 so as to cover a portion of the insulating region 114 and the source bus bar 112.

Also, notches (not shown) are formed at positions corresponding to the solder connection portions 15A to 15D on the conducting wire group sheet 16. The solder connection portions 15A to 15D are connected via the notches to the source bus bar 112, which is hidden below the conducting wire group sheet 16.

The conducting wire group sheet 16 collectively includes the conducting wires 161A to 161D that allow electricity to flow between the gate terminals 135A to 135D of the FETs 13A to 13D and the control circuit board 12. Specifically, in the conducting wire group sheet 16, the conducting wires 161A to 161D are formed on a flexible insulating film 162. That is, the gate terminals 135A to 135D of the FETs 13A to 13D are electrically connected to the control circuit board 12 via the conducting wire group sheet 16, which is flexible and changeable.

On the other hand, if the gate terminals 135A to 135D and the control circuit board 12 are connected using bus bars or the like of a metal material (hereinafter referred to as gate bus bars), the gate bus bars are arranged between the control circuit board 12 and the power circuit board 30. Accordingly, the dimension of the gate bus bars is determined by the interval between the control circuit board 12 and the power circuit board 30, and accuracy is required. Furthermore, if there is a large number of gate bus bars, the weight of the circuit board structure 10 will increase.

In contrast to this, in the circuit board structure 10 according to the present embodiment, the conducting wire group sheet 16 collectively includes the conducting wires for all of the FETs 13 (in FIGS. 3 and 4, the conducting wires 161A to 161D), and the gate terminals 135 of all of the FETs 13 are electrically connected to the control circuit board 12 via the deformable conducting wire group sheet 16.

Accordingly, compared to a case in which the gate bus bar is used, the degree of freedom in design increases, design error can be handled, and a reduction of the weight of the circuit board structure 10 can be achieved. Also, the gate bus bar is not present in the space between the control circuit board 12 and the power circuit board 30, and thus the structure is simpler and the space can be used effectively.

Also, in the circuit board structure 10 according to the present embodiment, the FETs 13A to 13D are provided such that the gate terminals 135A to 135D of the FETs 13A to 13D are all arranged in the rearward direction. That is, the gate terminals 135 of all of the FETs 13 are arranged on the insulating region 114 side, and all of the gate terminals 135 face the conducting wire group sheet 16. In this state, all of the gate terminals 135 are connected to the respective conducting wires 161 of the conducting wire group sheet 16.

Accordingly, the conducting wire group sheet 16 need only be provided only on a portion of the source bus bar 112 excluding the drain bus bar 111, and the conducting wire group sheet 16 can be simplified. Also, since the drain bus bar 111 is not covered, there is no more need to form notches for connecting the drain terminals 131 of the FETs 13 to the drain bus bar 111, and the structure is simpler.

Furthermore, the length of the conducting wires 161 can be shortened to the greatest extent possible, and the conducting wire group sheet 16 can be reduced in size. Accordingly, the circuit board structure 10 can be made compact.

With the circuit board structure 10 according to the present embodiment, the bus bars 111 and 112 and the seven FETs 13 are provided on the surface opposing the control circuit board 12 of the power circuit board 30, and the conducting wire group sheet 16 is adhered on the source bus bar 112.

Accordingly, the expanded portion 163 of the conducting wire group sheet 16 can be made smaller, and the circuit board structure 10 can be made more compact.

Also, in the conducting wire group sheet 16, a circuit element 18 (hereinafter referred to as "upper-side circuit element 18") such as a resistor, a coil, a capacitor, or a semiconductor element is further mounted on the portion adhered to the source bus bar 112. The upper-side circuit element 18 is insulated from the bus bars 111 and 112 by the insulating film 162. For example, the upper-side circuit element 18 may be electrically connected to a circuit pattern (not shown) formed on the insulating film 162, or may be connected to the control circuit board 12 via a predetermined conducting wire formed on the insulating film 162.

In this manner, in the circuit board structure 10 according to the present embodiment, it is possible to arrange the semiconductor element also on the bus bars 111 and 112 without complicating the structure, and therefore the space above the bus bars 111 and 112 can be utilized effectively. Accordingly, it is possible to make the circuit board structure 10 even more compact.

The embodiments disclosed herein are to be thought of as illustrative in all respects and not limiting. The scope of the present disclosure is indicated not by the above-described meanings, but by the claims, and all changes within the meaning and scope of equivalency to the claims are intended to be encompassed therein.

The invention claimed is:

1. A circuit board structure including a first circuit board having a rectangular conductive piece and a second circuit board arranged spaced apart from the first circuit board, a plurality of semiconductor elements being arranged on the conductive piece, and terminals of the plurality of semiconductor elements being connected to the conductive piece, wherein the plurality of semiconductor elements are aligned on two adjacent side edge portions of the conductive piece, the circuit board structure includes a conducting wire group sheet that is provided along the two side edge portions of the conductive piece and is provided with a plurality of conducting wires that allow electricity to flow between specific terminals of the semiconductor elements and the second circuit board, and the semiconductor elements are provided such that the specific terminals face the outer side of the conductive piece.

2. The circuit board structure according to claim 1, wherein the conducting wire group sheet includes an insulating film that insulates the conductive piece and the conducting wire from each other, the conducting wire group sheet is adhered on the conductive piece, and the circuit board structure includes an upper-side circuit element arranged on a portion of the conducting wire group sheet.

3. The circuit board structure according to claim 1, wherein the conducting wire group sheet is an FPC (Flexible Printed Circuit).

4. The circuit board structure according to claim 3, wherein the first circuit board and the second circuit board are arranged opposing each other, and the conducting wire group sheet is adhered on a surface of the first circuit board that opposes the second circuit board.

5. The circuit board structure according to claim 1, wherein the semiconductor elements are field effect transistors, and the specific terminals are gate terminals.

6. The circuit board structure according to claim 2, wherein the conducting wire group sheet is an FPC (Flexible Printed Circuit).

7. The circuit board structure according to claim 2, wherein the semiconductor elements are field effect transistors, and the specific terminals are gate terminals.

8. The circuit board structure according to claim 3, wherein the semiconductor elements are field effect transistors, and the specific terminals are gate terminals.

9. The circuit board structure according to claim 4, wherein the semiconductor elements are field effect transistors, and the specific terminals are gate terminals.

* * * * *